United States Patent
Jaeger et al.

(10) Patent No.: US 8,163,571 B2
(45) Date of Patent: Apr. 24, 2012

(54) MULTI-STEP DEPOSITION CONTROL

(75) Inventors: Roland Jaeger, Goerlitz (DE); Frank Wagenbreth, Dresden (DE); Frank Koschinsky, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/021,791

(22) Filed: Jan. 29, 2008

(65) Prior Publication Data

US 2008/0299681 A1  Dec. 4, 2008

(30) Foreign Application Priority Data

May 31, 2007 (DE) .................. 10 2007 025 341

(51) Int. Cl.
*H01L 21/00* (2006.01)

(52) U.S. Cl. .............. 438/8; 438/5; 438/22; 438/48; 257/E21.268; 257/E21.269; 257/E21.528

(58) Field of Classification Search ............ 438/8, 788, 438/5, 22, 48; 257/E21.268, E21.269, E21.528; 118/715–725
See application file for complete search history.

(56) References Cited

U.S. PATENT DOCUMENTS

| | | | | |
|---|---|---|---|---|
| 5,126,028 A | * | 6/1992 | Hurwitt et al. | 204/192.13 |
| 5,834,068 A | * | 11/1998 | Chern et al. | 427/535 |
| 6,093,634 A | * | 7/2000 | Chen et al. | 438/622 |
| 6,129,044 A | * | 10/2000 | Zhao et al. | 118/715 |
| 2004/0137714 A1 | | 7/2004 | Friedemann | 438/627 |
| 2004/0231799 A1 | * | 11/2004 | Lee et al. | 156/345.34 |
| 2004/0245091 A1 | * | 12/2004 | Karim et al. | 204/192.12 |
| 2005/0202756 A1 | * | 9/2005 | Moore et al. | 451/5 |
| 2005/0233582 A1 | | 10/2005 | Friedemann | 438/672 |

FOREIGN PATENT DOCUMENTS

DE  10 2005 046 972 A1  5/2007

* cited by examiner

*Primary Examiner* — Charles Garber
*Assistant Examiner* — Abdulfattah Mustapha
(74) *Attorney, Agent, or Firm* — Williams, Morgan & Amerson

(57) ABSTRACT

For providing control of two-step or a multi-step deposition process, a method and a corresponding deposition system is provided comprising providing a deposition process having at least two sub-processes employing different sets of process parameters, wherein each set of process parameters comprises at least one process parameter. The method comprises controllably generating an actual value for at least one first process parameter by taking into account at least one previous value of the respective first process parameter, wherein each first process parameter is a process parameter of said at least two sets of process parameters.

8 Claims, 2 Drawing Sheets

MULTI-STEP DEPOSITION CONTROL

BACKGROUND OF THE INVENTION

1. Field of the Invention

The present disclosure relates to the field of integrated circuit manufacturing, and, more particularly, to the field of depositing materials with a two-step or a multi-step deposition process.

2. Description of the Related Art

During the process of manufacturing sophisticated semiconductor devices, such as modern CPUs, a plurality of different material layers are deposited on each other and patterned to define required device features. In general, subsequent material layers should exhibit a good adhesion to each other while at the same time maintain the integrity of each individual layer, i.e., chemical reaction of adjacent layers and/or diffusion of atoms from one layer into the other layer should be avoided. To meet these requirements, an intermediate layer is often required to provide good adhesion and to suppress diffusion and thus undue interference between neighboring materials during processing and operation. A typical example for such requirements in the fabrication of semiconductor devices is the formation of interconnect plugs and metal interconnects, wherein openings and trenches having a bottom region and a sidewall region have to be provided with a corresponding intermediate layer, that is, a conductive barrier layer, so that a subsequently deposited conductive material exhibits good adhesion to the surrounding dielectric layer and undue interaction during processing and operation may be avoided. In advanced semiconductor devices, the interconnect plugs may be formed of tungsten-based metal that is provided in a dielectric material which is typically comprised of silicon dioxide including a bottom etch stop layer typically formed of silicon nitride.

Other examples of the formation of contact plugs relates to copper-based techniques. For example, in modern integrated circuits, copper is often used as conductive material for forming electrical connections between the circuit elements. To this end, one or more wiring levels or layers are provided, which include metal lines and metal regions, establishing the electrical connections. While aluminum is a well-approved metal in the semiconductor industry, in modern integrated circuits, highly conductive metals such as copper and alloys thereof are increasingly used to accommodate the high current densities encountered during the operation of the devices, as the ongoing reduction of feature sizes also leads to reduced dimensions of the metal lines and vias. Consequently, the metallization layers may comprise metal lines and vias formed from copper and copper alloys. To provide the required adhesion and diffusion blocking characteristics to the copper, a conductive barrier layer is usually provided. Typical materials for the barrier layer are tantalum, tantalum nitride, titanium, titanium nitride and the like. The copper metallization layer may be formed on the basis of well-established single or dual damascene or inlay techniques, in which a dielectric layer may be deposited first and may be subsequently patterned so as to receive via openings or trenches which may then, commonly or separately, be filled with the copper-based material. The trenches and vias are subsequently coated with an appropriate barrier material, wherein subsequently copper may be filled in by electroplating or any other appropriate deposition techniques. In other damascene regimes, a via layer may be formed first and subsequently the interlayer dielectric material may be deposited in an appropriate thickness so as to form therein trenches for receiving the respective metal lines. Thereafter, the barrier layer may be formed on the basis of well-established techniques, for example sputter techniques or chemical vapor deposition (CVD) techniques. On the barrier layer, a copper seed layer may be provided, for example by sputtering. Filling in the copper-based metal may then be performed either by sputter deposition techniques or by plating techniques, for example, electroplating or electroless plating. After filling in the copper-based metal for forming the metal lines, any excess material, such as excess copper and excess barrier material, may be removed by chemical mechanical polishing (CMP), electrochemical polishing and the like.

In general, the electrical resistance of the barrier layer metal is significantly higher than the resistance of the tungsten-based material forming in the contact plug so that the thickness of the barrier metal layer is selected to be as small as possible in order to avoid an undue increase of the overall resistance of the contact plug.

In modern integrated circuits, openings (so-called vias) are formed exhibiting an aspect ratio that may be as high as approximately 8:1 or more, and the opening may have a diameter of 0.1 μm or smaller. The aspect ratio of such openings is generally defined as the ratio of the depth of the opening to the width of the opening. Accordingly, it is extremely difficult to form a thin uniform barrier metal layer on the entire sidewalls, especially at the bottom corners, to effectively avoid direct contact of the metal with the surrounding dielectric material. In other words, it is difficult to form a barrier metal layer that adequately covers all surfaces of the openings while on the other hand being as thin as possible.

An example of a contact plug as described above is an interconnect plug for providing connection to a circuit element, such as a transistor that is formed above an appropriate semiconductor substrate. The circuit element may be comprised of one or more contact regions, such as a gate electrode and drain and source regions. The circuit element is covered by a dielectric material, which may comprise a contact etch stop layer which may be formed of silicon nitride, and an interlayer dielectric material, which is typically silicon dioxide. Contact openings are formed in the dielectric material to connect the respective contact regions of the circuit element. A conductive barrier layer, e.g., a titanium liner and a titanium nitride layer in a tungsten contact technology, is formed within the contact openings. The titanium liner and the titanium nitride layer may be formed to enhance the reliability of the subsequent deposition of a tungsten-based material.

As already mentioned before, the liners and barrier layers described above may be formed on the basis of an ionized physical vapor deposition, such as sputter deposition. The term "sputtering" or "sputter deposition" describes a mechanism in which atoms are ejected from a surface of a target material upon being hit by sufficiently energetic particles. Sputtering has become a dominant technique for deposition of titanium, titanium nitride and the like. Although, in principle, improved step coverage could be obtained by using CVD techniques, sputter deposition is widely used for the deposition of a liner for the following reasons.

Sputter deposition allows the relatively uniform deposition of layers over large-area substrates since sputtering may be accomplished from large-area targets. Control of film thickness by sputter deposition is relatively simple as compared to CVD deposition and may be achieved by selecting a constant set of operating conditions, wherein the deposition time is then adjusted to achieve the required film thickness. Moreover, the composition of compounds such as titanium nitride may be controlled more easily and precisely in sputter deposition processes compared to CVD. Additionally, the surfaces of the substrates to be processed may be sputter-cleaned prior to the actual film deposition so that any contamination of the surface may be efficiently removed and further recontamination prior to the actual deposition process may be effectively suppressed. For an efficient deposition for moderately thin material within the contact openings having a moderately high aspect ratio, so-called ionized sputter deposition techniques are used in which target atoms liberated from the target are efficiently ionized by a respective plasma ambient while removing towards the substrate. On the basis of a DC or RF bias, the directionality of the moving ionized target atoms may be significantly enhanced, thereby enabling the deposition of target material at the bottom of the contact openings, even for high aspect ratios.

Depending on the respective process parameters, the layer thickness at the bottom of the contact hole may be significantly thicker compared to a thickness at the sidewalls of the contact openings. In particular, at lower sidewall portions, the corresponding material thickness may be significantly thinner compared to the thickness at the bottom of the contact opening. However, a reliable and thus minimum layer thickness may be required, especially at the bottom sidewall portions, in order to substantially prevent any adverse interaction of the subsequently deposited tungsten and the dielectric layer.

As described above, deposition of materials in high aspect ratio contact holes may be performed by chemical vapor deposition processes or by physical vapor deposition processes. However, as indicated above, configurations exist where it is desirable to use physical vapor deposition although chemical vapor deposition processes are more likely to uniformly cover the surface of high aspect ratio holes. A primary method for depositing films by physical vapor deposition is sputtering. One problem associated with obtaining good bottom step coverage utilizing physical vapor deposition is a material overhang at the shoulder, i.e., at the corner of sidewalls and the top surface of contact openings.

FIG. 1A schematically show an example of a contact hole 10 in a dielectric layer 12, the contact hole having sidewalls 13 and a bottom 14. FIG. 1B shows the contact hole 10 of FIG. 1A in a further advanced manufacturing stage, where a material layer 16 has been deposited on the dielectric layer 12 and in the contact hole 10. At upper corners 18, a material overhang 20 is formed. Such a material overhang 20 hinders appropriate filling of the contact hole 10 and also hinders material 16 to be deposited on sidewalls 13 of the contact hole 10. Another problem is obtaining adequate bottom step coverage. In particular, the layer thickness of the material layer 16 on sidewalls 13 close to the bottom 14 of the contact hole 10 is decreased with respect to the thickness of the material layer on the dielectric layer 12, as indicated in FIG. 1B. To overcome this problem, it has been proposed to use a two-step sputter process, wherein, during a first step, a desired material is deposited in the contact hole. During this deposition process, a shoulder may form on the upper edge of the contact hole as shown in FIG. 1B. Subsequently, in a re-sputtering step, the shoulder may be removed or at least reduced. Re-sputtering may be performed by applying a bias voltage to the substrate and/or by varying the working gas, e.g., in terms of pressure and/or composition. The time period for this re-sputtering step may be in the range of less than 60 seconds. The re-sputtering further leads to a redistribution of the re-sputtered atoms, part of which are deposited lower in the contact hole, thereby improving step coverage. Upon appropriate choice of process parameters, a relatively uniform film thickness of the material layer 16 along the sidewalls 13 of the contact hole 10 may be achieved by performing a re-sputter step, as indicated in FIG. 1C. Further, a beveled upper edge 22 of the material layer 16 at the corner 18 is usually obtained which is advantageous in the subsequent filling of the remaining hole 24.

Generally, metal sputter deposition processes are characterized by a decrease in the deposition rate as the sputter target life degrades. The decrease and inconsistencies in the deposition rate are driven by various reasons. Material may build up on chamber shields, e.g., a collimator. Further, target erosion may influence sputter uniformity over the target. Further, the power supplied to the target may vary and hence may result in variations of the sputter rate. Further, variations in gas flow and pressure may also give rise to variations in the deposition rate. For two-step and/or multi-step metal sputtering deposition processes, a decrease in the position rate may be difficult to compensate. A common method of open-loop compensation, which is typically employed internally to the sputter tool itself, is limited to simple one-step processes.

The present disclosure is directed to various methods and systems that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally the subject matter disclosed herein is directed to a technique for controlling a multi-step deposition technique which comprises at least two sub-processes employing different sets of process parameters. The process parameters of the at least two sub-processes include at least one process parameter, hereinafter referred to as the first process parameter, for which an actual value is generated by taking into account at least one previous value of the respective first process parameter.

According to one illustrative embodiment disclosed herein, a method comprises providing a deposition process having at least two sub-processes employing different sets of process parameters. Each set of process parameters comprises at least one process parameter. For at least one first process parameter, an actual value is controllably generated by taking into account at least one previous value of the respective first process parameter. Each first process parameter is a process parameter of the at least two sets of process parameters.

According to another illustrative embodiment disclosed herein, a method comprises providing a first set of process parameters defining a sputter process, wherein material is deposited on a wafer, and providing a second set of process parameters defining a re-sputter process, wherein part of the deposited material is removed from the wafer. For each first process parameter, an actual value is controllably generated by taking into account at least one previous value of the respective first process parameter. Each first process parameter is a process parameter of one of the first set of process parameters and the second set of process parameters.

According to still another illustrative embodiment disclosed herein, a deposition system comprises a wafer receiving unit configured for receiving a wafer, a deposition unit, a memory and a control unit. The control unit is configured to control the deposition unit so as to deposit a material layer on the wafer received in the wafer receiving unit by a deposition process. The deposition process has at least two process steps employing different sets of parameters, wherein each of the at least two sets of process parameters comprises at least one process parameter. Further, the control unit is configured for depositing the material layer in accordance with the deposition process by generating an actual value for at least one first process parameter of the process parameters by taking into account of the respective first process parameter at least one previous value stored in the memory.

BRIEF DESCRIPTION OF THE DRAWINGS

The disclosure may be understood by reference to the following description taken in conjunction with the accompanying drawings, in which like reference numerals identify like elements, and in which.

Figure 1A:
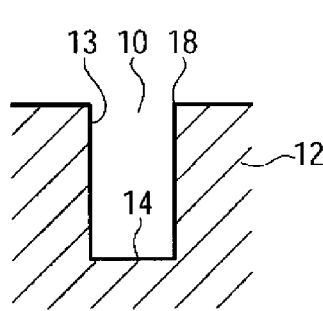
FIGS. 1A-1C schematically show cross-sectional views of a semiconductor device during the formation of a material layer by a sputtering and a re-sputtering process.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
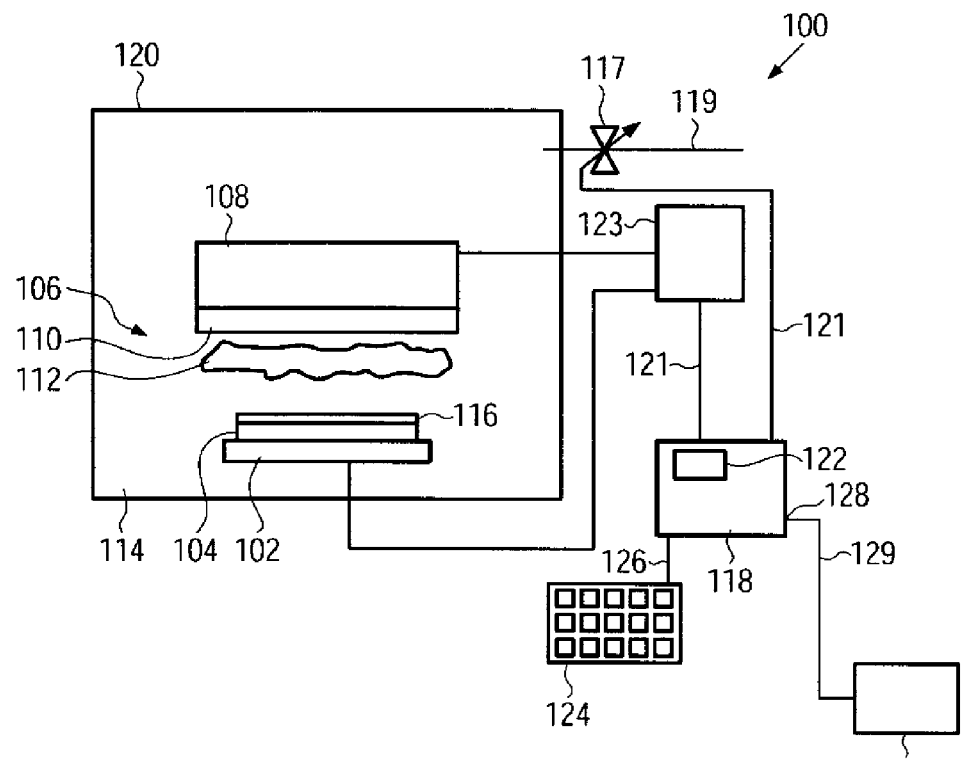
FIG. 2 schematically shows a deposition system in accordance with illustrative embodiments disclosed herein.

FIG. 2 shows a deposition system 100 in accordance with illustrative embodiments disclosed herein. The deposition system 100 comprises a wafer receiving unit 102 configured for receiving a wafer 104. The wafer receiving unit 102 may be of any appropriate kind capable of receiving the wafer 104. According to one illustrative embodiment, the wafer receiving unit 102 comprises a wafer retaining unit (not shown) for retaining the wafer 104 on the wafer receiving unit 102 according to well-established techniques. For example, a wafer retaining unit may comprise mechanical holders or suction inlets (not shown) for reducing a pressure between the wafer 104 and the wafer receiving unit 102.

The deposition system 100 further comprises a deposition unit 106. According to one illustrative embodiment, the deposition unit 106 is a sputter deposition unit having a target holder 108 and a target 110. The target 110 is positioned facing the wafer. A plasma 112 is established by a plasma generator (not shown). For example, the plasma generator may include an anode electrode, of which, by applying a suitable voltage (e.g., 600 V) between an anode electrode and the target, electrons are emitted from the target which travel towards the anode electrode while ionizing the working gas 114 and thereby generating the plasma 112. According to other embodiments, other types of plasma generators may be employed, e.g., plasma generators using RF transmitters. By applying a voltage between the substrate receiving unit 102 and the target 110, ions of the plasma 112 are accelerated towards the target 110 and hit on the target 110 to provide free target material traveling towards the wafer 104 to form thereon a desired material layer 116 of the target material. If the desired material layer 116 is a composition, e.g., an alloy, the target may already consist of the composition. In other embodiments, multiple targets may be provided which are sputter-operated simultaneously or alternating. It should be understood that FIG. 2, and in particular the thickness of the material layer 116 and the wafer 104, is not drawn to scale but is exaggerated for illustration purposes.

The deposition system 100 further comprises a control unit 118 configured to control the deposition unit 106 so as to perform sub-processes, e.g., to deposit the material layer 116 on the wafer 104 received in the wafer receiving unit 102 by a deposition process. For instance, the control unit 118 may be configured to control the deposition unit 106 to perform a sputtering process as described above. The deposition process has at least two process steps employing different sets of parameters. A set of process parameters may comprise any number of process parameters, e.g., one process parameter or two or more process parameters. A process parameter may be any parameter which influences the deposition process, e.g., a temperature, or which is a result of other process parameters, e.g., a deposition rate. For instance, a process parameter of the sputter process discussed above may be any parameter related to the plasma generator, the bias voltage between the target 110 and the wafer 104, the distance between the target 110 and the substrate 104, the temperature of the working gas 114, the pressure of the working gas 114, a flow rate of the working gas 114 through a chamber 120 which includes the deposition unit 106 and the wafer 104, an effective deposition rate of deposition or removal of material 116, etc. It should be understood that, although several of the above-mentioned process parameters, e.g., the parameter related to the plasma generator, is related to a sputter deposition process, other of the above-mentioned process parameters may be suitable process parameters for other deposition techniques, e.g., the temperature, pressure and flow rate of the working gas.

According to one illustrative embodiment, the system 100 includes a first set of process parameters defining a deposition sub-process, wherein material 116 is deposited on a wafer 104, and a second set of process parameters defining a removal sub-process, wherein part of the deposited material 116 is removed from the wafer 104. For instance, the deposition sub-process is a sputter process and the removal sub-process is a re-sputter process. For example, in contrast to a normal sputter process, a re-sputter process may be invoked by applying a respective bias voltage between the target 110 and the wafer receiving unit 102 such that ions of the plasma 112 are accelerated towards the wafer 104 and impinge on the wafer 104, thus leading to sputtering of the already deposited material layer 116. According to some embodiments, a re-sputter process may be invoked by any other well-established means, e.g., by changing the working gas pressure and/or composition. To this end, one or more control elements, e.g., valves 117, may be provided to control a flow of working gas 114 through a supply line 119 into the chamber 120.

According to one illustrative embodiment, the control unit 118 is configured for providing control signals 121 to process parameter adjusting components, such as a voltage source 123 for generating the bias voltage between the target and the wafer receiving unit 102, the at least one working gas valve 117, etc.

According to some illustrative embodiments, the deposition unit 106 is capable of performing the deposition sub-process and the removal sub-process. According to other embodiments, different processing units are provided for each or part of the at least two deposition processes.

According to other illustrative embodiments, the control unit 118 is configured for forming a weighted average of at least two previous values of the respective first process parameter, i.e., the at least two previous values are taken into account for generating the actual value of the respective process parameter.

According to other illustrative embodiments, the control unit 118 is configured for generating respective weights for the at least two previous values, wherein the respective weights are inversely proportional to the time period between the actual value and the respective previous value. According to still another illustrative embodiment, the weights are exponentially decreasing with the time period between the actual value and the respective previous value, i.e., according to this embodiment, the weighted average is an exponentially weighted average.

According to some illustrative embodiments, one or more first process parameter is an effective deposition rate of one of the sub-processes.

According to other illustrative embodiments, the control unit 118 is configured for generating an actual value of at least one second process parameter by taking into account at least one first process parameter. For example, all first process parameters or part of the first process parameters may be used for generating the actual value. For example, a second process parameter may be a process parameter derived from at least one of the first process parameters. For example, a model for describing the deposition process may be provided which allows the determination of the second process parameter from first parameters.

According to one illustrative embodiment, at least one of the first process parameters used to derive the second process parameter is an effective deposition rate of a respective one of the sub-processes. According to illustrative embodiments, the control unit 118 is configured for generating for each effective deposition rate a respective deposition time as the second parameter.

An effective deposition rate of the removal sub-process may be represented in the control unit 118 as a superposition of a positive deposition sub-rate and a negative etch sub-rate. According to one embodiment, the negative etch sub-rate is a first process parameter, an actual value of which is generated by taking into account at least one previous value of the negative etch sub-rate.

According to one illustrative embodiment, the control unit 118 comprises an interface 128 for establishing a data connection 129 with a metrology tool 130. For example, the metrology tool 130 may be provided for determining a characteristic of the material layer 116 deposited on the wafer 104. A characteristic of this kind may be related to a thickness of the material layer 116, e.g., a final average thickness of the material layer 116, a thickness uniformity of the material layer, in particular along the depth of walls of a contact hole, a relationship between the thickness of the material layer 116 at the bottom of a contact hole in a dielectric layer, and the thickness of the material layer 116 at the top of the dielectric layer, etc. According to other embodiments, the metrology tool may be provided for determining other characteristics of the material layer, e.g., a composition or a composition uniformity over a wafer area of the wafer or along a thickness of the material layer 116.

According to one illustrative embodiment, process parameters of the deposition process may be varied, e.g., automatically, upon request or manually, in response to the result obtained by the metrology tool. Process parameters varied in response to metrology results may be first process parameters or may be non-first process parameters, i.e., process parameters actual values of which are generated without taking into account at least one previous value of the respective process parameter. The metrology tool 130 may provide the at least one characteristic of the material layer 116 to the control unit 118. The control unit 118 may be configured to generate an actual value of a process parameter from the characteristic. Further, if a model for the deposition process is provided for determining a second process parameter, the at least one characteristic of the material layer 116 may be used to modify the model or to provide input values to the model.

According to one illustrative embodiment, the control unit 118 is part of an advanced process control (APC) of a manufacturing process of an integrated semiconductor. For example, while, in conventional process controls, process parameters of a manufacturing process are only modified depending on relatively rare exemplary metrology processes, providing a model which is capable of describing the manufacturing process to a certain extent has the advantage that, for each run, set-point values may be provided for the process parameters involved, thereby allowing for more precise and more reliable control. Further, the yield of the manufacturing process may be increased in this way. In terms of statistical process control (SPC), illustrative embodiments disclosed herein are capable of providing a higher process capability index (Cpk).

Figures 3A, 3B, 3C:
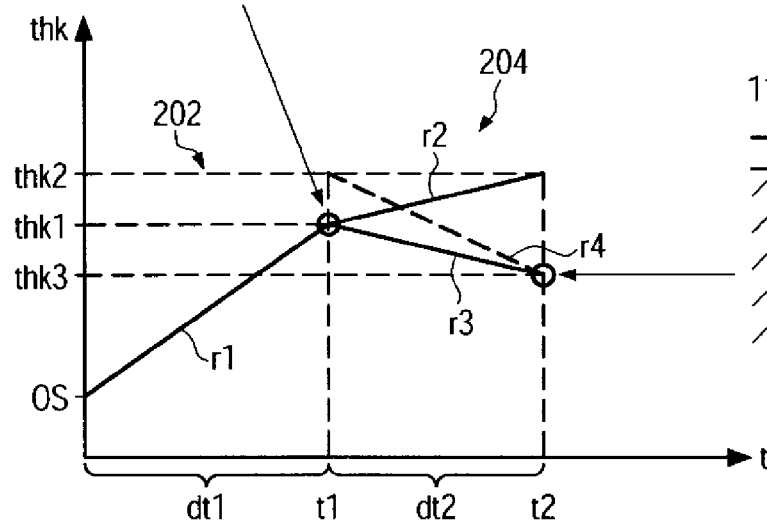
FIG. 3 schematically illustrates a method in accordance with illustrative embodiments disclosed herein and a respective model for a deposition process.

FIGS. 3A-3C illustrate a method in accordance with illustrative embodiments disclosed herein. A deposition process 200 is provided having at least two sub-processes 202, 204 employing different sets of process parameters r1, dt1; r2, r3, r4, dt2, wherein each set of process parameters comprises at least one process parameter r1, dt1; r2, r3, r4, dt2. The method comprises controllably generating for at least one first process parameter r1, r2, r3, r4 an actual value of which is generated by taking into account at least one previous value of the respective first process parameter r1, r2, r3, r4. Each first process parameter is a process parameter of the at least two sets of process parameters.

Figure 1B:
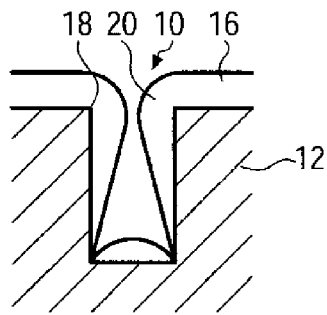
Figure 1C:
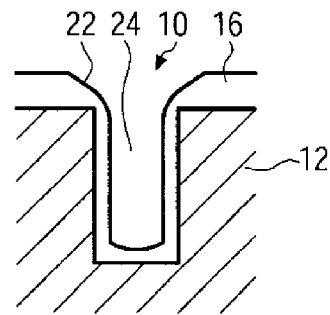

As far as elements of an inventive deposition system are referred to, reference signs of respective elements of the deposition system 100 illustrated in FIGS. 1A-1C are provided. However, it should be understood that these reference signs are provided only for illustrative purposes and should not be regarded as limiting.

According to one illustrative embodiment, the at least two sets of process parameters include a first set of process parameters r1, dt1 defining a deposition sub-process 202 wherein material 116 is deposited on a wafer 104. A second set of process parameters r2, r3, r4, dt2 defines a removal sub-process 204 wherein part of the deposited material 116 is removed from the wafer 104. With regard to FIG. 3A, reference numbers for only the first process parameters r1, r2, r3, r4 and the second parameters dt1, dt2 of the particular embodiment illustrated in FIG. 3A have been specified. However, it should be understood that the set of process parameters which defines the respective sub-process may comprise further process parameters in excess to the first process parameters and the second process parameters. For example, the set of process parameters may include a pressure of a working gas in a sputter deposition device as a process parameter. Hence, specifying "a second set of process parameters r2, r3, r4, dt2 defines a removal sub-process" should not considered as limiting the second set of process parameters to r2, r3, r4 and dt2. Rather, the reference numbers only specify process parameters which are illustrated in FIG. 3A. It should be understood that the same applies to the claims.

According to one illustrative embodiment, the deposition sub-process 202 is a sputter process and the removal sub-process 204 is a re-sputter process. In this respect, FIG. 3B illustrates an example of a material layer 116 on a dielectric 140 of an integrated semiconductor device 142 after performing the deposition sub-process 202. Here, FIG. 3B corresponds to FIG. 1B, the description of which is not repeated here. FIG. 3C illustrates an example of a material layer 116 on a dielectric 140 after performing the removal sub-process 204. Here, FIG. 3C corresponds to FIG. 1C, the description of which is not repeated here.

According to one illustrative embodiment, taking into account at least one previous value of the respective first process parameter may comprise forming a weighted average of at least two previous values of the respective first process parameter. According to still another illustrative embodiment, the weight of the respective value is reduced, e.g., exponentially reduced, with increasing time period between the actual value and the respective previous value. As described with regard to FIGS. 1A-1C, "at least two previous values" may be a respective number of last previous values. Herein, the averaging window advances by one each time the averaging is performed. In this sense, such an embodiment of an average is a moving average.

According to one illustrative embodiment, at least one first process parameter is an effective deposition rate of one of the sub-processes. For example, according to one illustrative embodiment, the effective positive deposition rate r1 of the deposition sub-process 202 is a first process parameter, an actual value of which is generated by taking into account at least one previous value of the effective deposition rate r1 of the deposition sub-process 202. According to another illustrative embodiment, the effective negative deposition rate r3 of the removal sub-process 202 is a first process parameter, an actual value of which is generated by taking into account at least one previous value of the effective deposition rate r3 of the removal sub-process 204.

According to one illustrative embodiment of a method, an actual value of at least one second process parameter is generated by taking into account at least one first process parameter. For example, the method may comprise generating for each effective deposition rate r1, r3 a respective deposition time dt1, dt2 as the second parameter.

Still another illustrative embodiment comprises treating an effective deposition rate r3 of the removal sub-process 204 as a superposition of a positive deposition sub-rate r2 and a negative etch sub-rate r4. For example, in the case of re-sputtering, material of the target 110 is deposited on the wafer 104 with the positive deposition sub-rate r2 and at the same time material 116 is sputtered from the wafer 104 with the negative etch sub-rate r4. The effective deposition rate r3, i.e., the net deposition rate of the removal sub-process 204, is negative in the removal sub-process 204, as illustrated in FIG. 3A.

According to one illustrative embodiment, the negative etch sub-rate is a first process parameter, an actual value of which is generated by taking into account at least one previous value of the negative etch sub-rate.

In accordance with one illustrative embodiment, an exemplary model is provided which enables the determination of the deposition times dt1 and dt2 in the above-mentioned example.

For a precise control of the thickness of the material layer 116, effective deposition rates as well as the corresponding deposition times should be known. According to one illustrative embodiment, the effective deposition sub-rate r1 of the deposition sub-process, the effective deposition sub-rate of the removal sub-process r2 and the etch sub-rate r4 are involved are selected as first process parameters an actual value of which is generated by taking into account at least one previous value of the respective first process parameter r1, r2 and r4.

As illustrated in FIG. 3A, the deposition sub-process 202 starts with an offset thickness OS. According to other embodiments, the offset thickness is zero. Performing the deposition sub-process 202 with an effective deposition sub-rate r1 results in a thickness thk1. Performing the removal sub-process 204 with an effective deposition sub-rate r3 results in a thickness thk3. However, as outlined above, the removal sub-process may be regarded as a superposition of a positive deposition sub-rate r2 and a negative etch sub-rate r4. Performing a deposition process with the deposition sub-rate r2 would result in a (hypothetical) thickness thk2. The thickness thk2 corresponds to a "removal" sub-process without re-sputtering, e.g., by performing the removal sub-process without a respective bias power. Performing a removal process with the etch sub-rate r4 would result in the thickness thk3 which is obtained by considering the effective deposition rate r3.

According to one illustrative embodiment, the respective process parameters may be determined as follows. An estimated value of the etch sub-rate r4 for a new deposition run may be obtained from an exponentially weighted moving average of at least two previous etch sub-rate values. An estimated value of the effective deposition rate r1 of the deposition sub-process 202 for a new deposition run may be obtained from an exponentially weighted moving average of at least two previous deposition sub-rate values. An estimated value of the effective deposition rate r3 of the removal sub-process 204 for a new deposition run may be obtained from an exponentially weighted moving average of at least two previous deposition sub-rate values.

The exemplary algorithm is characterized through two target parameters:

| | |
|---|---|
| thk3 | is the desired total thickness |
| thk-etch-target = thk2 − thk3 | is the desired thickness difference that characterizes the re-sputter part |

The respective deposition times may then be calculated from the following model equations:

From FIG. 3A is obtained:

| | | |
|---|---|---|
| etch sub-rate | r4 = (thk2 − thk3)/dt2; | (1) |
| hence | dt2 = thk-etch-target/etch sub-rate | (2) |

From FIG. 3A is further obtained:

| | | |
|---|---|---|
| effective deposition sub-rate | r3 = (thk1 − thk3)/dt2; | (3) |
| hence | thk1 = r3 × dt2 + thk3 | (4) |

From FIG. 3A:

| | | |
|---|---|---|
| effective deposition rate | r1 = (thk1 − OS)/dt1 | (5) |
| hence | dt1 = (thk1 − OS)/r1 | (6) |

Using formulas (1) and (2), a new dt2 value is calculated. As these formulas indicate, the new dt2 value is calculated to hit the thk-etch-target and hence the desired re-sputtering as close as possible.

With the new dt2 and the formulas (3), (4), (5) and (6), the new value for dt1 is determined. Formulas (3), (4), (5) and (6) are designed to hit the desired total thickness as close as possible. In the illustrated embodiment, the thk1 value from formula (4) serves as an assistance value and is therefore not considered as target value.

According to one illustrative embodiment, the at least one previous value is a value of a respective previous deposition process, i.e., the control of the process parameters is a run-to-run control. The present invention and embodiments thereof are capable of simplifying manufacturing, reducing costs of manufacturing, improving accuracy and precision and providing new functionality.

As a result, the subject matter disclosed herein provides an enhanced technique that enables the control of multi-step deposition processes. For this purpose, an actual value of at least one first process parameter is controllably generated by taking into account at least one previous value of the respective first process parameter. Embodiments include providing a second process parameter by taking into account at least one first process parameter. The second process parameter may be generated using a model for the deposition process. An exemplary model for a sputter/re-sputter process is capable of providing deposition times based on deposition rates as first parameters.

The proposed model for a two-step process has been proposed which is illustrated in FIG. 3A and is characterized through three thickness parameters:

thk1=thickness after process time dt1 with the deposition sub-process 202 thk2=thickness after process time dt2 with the removal sub-process 204 and no re-sputtering (no bias power)

thk3=total thickness after process time dt2 with re-sputtering.

Compared to open loop compensation, quality and productivity could be greatly improved. Quality has been recognized from a better process capability index (Cpk) and excellent centering of the control charts. Productivity improvements are time saving, equipment availability and reduced costs.

Although a sputter process and a re-sputter process have been described as being carried out in the same chamber by only varying process parameters, it should be understood that the invention is not limited hereto. Rather, according to other illustrative embodiments of a deposition process, the deposition sub-process and the removal sub-process may be carried out at spatially distant locations. Further, the deposition sub-process and the removal sub-process may be of different process type. For example, the deposition sub-process may be a CVD process or plating process, whereas the removal sub-process may be a re-sputter process or an etching process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a deposition process having at least two sub-processes comprising a deposition sub-process wherein material is deposited on a wafer and a removal sub-process wherein part of said deposited material is removed from said wafer following the deposition sub-process;
   generating a deposition time for the removal sub-process based on at least one previous value of an effective deposition rate for the removal sub-process and a target thickness of the material following the deposition sub-process and the removal sub-process.

2. The method of claim 1, wherein generating the deposition time for the removal sub-process comprises generating the deposition time for the removal sub-process based on an offset thickness of the material prior to the deposition sub-process.

3. The method of claim 1, wherein generating the deposition time comprises forming a weighted average of at least two previous values of the deposition time and wherein the weight of the respective value is reduced with increasing time period between the generated deposition time and the respective previous value of the deposition time.

4. The method of claim 3, wherein the weighted average is an exponentially weighted average.

5. The method of claim 1, wherein generating the deposition time comprises generating the deposition time based upon a deposition rate of the deposition sub-process.

6. The method of claim 2, further comprising treating the effective deposition rate of the removal sub-process as a superposition of a positive deposition sub-rate and a negative etch sub-rate and comprising estimating the effective deposition rate based on previous estimates of the positive deposition sub-rate and negative etch sub-rate.

7. The method of claim 1, wherein respective previous deposition process has been performed in a previous run on a different substrate.

8. The method of claim 1, wherein the deposition sub-process is a sputter process and the removal sub-process is a re-sputter process.

* * * * *